(12) United States Patent
Kim et al.

(10) Patent No.: US 10,692,702 B2
(45) Date of Patent: Jun. 23, 2020

(54) APPARATUS FOR TREATING SUBSTRATE

(71) Applicant: SEMES CO., LTD., Chungcheongnam-do (KR)

(72) Inventors: Hyung Joon Kim, Gyeonggi-do (KR); Hyungchul Moon, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 59 days.

(21) Appl. No.: 14/663,658

(22) Filed: Mar. 20, 2015

(65) Prior Publication Data

US 2015/0279630 A1  Oct. 1, 2015

(30) Foreign Application Priority Data

Mar. 27, 2014  (KR) .................. 10-2014-0035931

(51) Int. Cl.
*H01J 37/32* (2006.01)
*H01L 21/67* (2006.01)

(52) U.S. Cl.
CPC ...... *H01J 37/32522* (2013.01); *H01J 37/321* (2013.01); *H01J 37/32119* (2013.01); *H01J 37/32715* (2013.01); *H01L 21/67069* (2013.01); *H01L 21/67115* (2013.01); *H01J 2237/334* (2013.01)

(58) Field of Classification Search
CPC ........... H01J 37/32522; H01J 37/32715; H01J 21/67069; H01J 37/32119; H01J 37/321; H01J 21/67115; H01J 2237/334
See application file for complete search history.

(56) References Cited

U.S. PATENT DOCUMENTS

| 5,990,017 A | * | 11/1999 | Collins | ............. H01L 21/31116 216/67 |
| 6,476,362 B1 | * | 11/2002 | Deacon | ............. H01L 21/67115 118/50.1 |
| 2004/0083971 A1 | * | 5/2004 | Holland | ................. H01J 37/321 118/721 |

(Continued)

FOREIGN PATENT DOCUMENTS

| JP | 2002-246376 A | 8/2002 |
| JP | 2002246376 A * | 8/2002 |

(Continued)

OTHER PUBLICATIONS

Office Action for corresponding Chinese Application No. 201510137550.2 dated Jul. 29, 2016.

*Primary Examiner* — Yuechuan Yu

(74) *Attorney, Agent, or Firm* — Carter, DeLuca & Farrell LLP

(57) ABSTRACT

Disclosed is a substrate treating apparatus which includes a chamber, a support unit, a dielectric plate, a gas supplying unit, an antenna, and a heating unit. The chamber has a processing space therein, and an upper surface of the processing space is opened. The support unit is disposed in the chamber and supports a substrate. The dielectric plate is installed on the opened upper surface of the chamber to cover the opened upper surface. The gas supplying unit supplies a gas in the chamber. The antenna is disposed above the dielectric plate and creates plasma from the gas. The heating unit is disposed above the antenna and heats the dielectric plate.

11 Claims, 10 Drawing Sheets

(56) References Cited

U.S. PATENT DOCUMENTS

| | | | | |
|---|---|---|---|---|
| 2007/0004208 A1* | 1/2007 | Ohkuni | ............ | C23F 4/00 |
| | | | | 438/689 |
| 2008/0179290 A1* | 7/2008 | Collins | ............ | H01J 37/32357 |
| | | | | 216/67 |
| 2011/0168673 A1* | 7/2011 | Nishimoto | ........ | H01J 37/32192 |
| | | | | 216/67 |

FOREIGN PATENT DOCUMENTS

| | | |
|---|---|---|
| JP | 2012-049393 A | 3/2012 |
| KR | 2000-0010643 A | 2/2000 |
| KR | 100377095 B1 | 3/2003 |
| KR | 2003-0059046 A | 7/2003 |
| KR | 10-2004-0082642 A | 9/2004 |
| KR | 2008-0056611 A | 6/2008 |
| KR | 2011-0007251 A | 1/2011 |

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2014-0035931 filed Mar. 27, 2014, in the Korean Intellectual Property Office, the entire contents of which are hereby incorporated by reference.

BACKGROUND

Embodiments of the inventive concepts described herein relate to a substrate treating apparatus, and more particularly, relate to an apparatus for treating a substrate using plasma.

In general, plasma means ionized gas formed of ions, electrons, radicals, etc. The plasma is created by very high temperature, strong electric field or high-frequency electric and magnetic field.

A plasma processing apparatus is an apparatus that converts a reactant into a plasma state to deposit it on a semiconductor substrate and clears, ashes, or etches the semiconductor substrate using the reactant of the plasma state.

The development of a semiconductor industry enables a semiconductor device to have large capacity and high functionality. Accordingly, it is necessary to integrate more elements within a narrow space. For this reason, a semiconductor device manufacturing technique is being developed and researched for scale-down and high integration of patterns. For such scale-down and high integration of patterns, a dry etching technique using plasma is being applied to a manufacturing process. In the dry etching technique, reaction gas is activated to be converted into a plasma state, and positive ions or radicals of the plasma state of reaction gas etches a predetermined area of a semiconductor substrate.

In particular, an Inductively Coupled Plasma (ICP) process apparatus uses a dielectric window as a transfer path of a high-frequency power. At the beginning of a process or during a process, there is generated the event that process results are different from each other because a temperature varies due to influence of a plasma in a chamber while the process is performed.

Accordingly, a heater is provided to surround a dielectric window outside a conventional dielectric window to heat the dielectric window heating method. In this case, however, a center area of the dielectric window is heated less than an edge portion of the dielectric window, thereby lowering process efficiency.

SUMMARY

Embodiments of the inventive concepts provide a substrate treating apparatus capable of improving process efficiency by heating the whole dielectric plate when treating a substrate using plasma.

Embodiments of the inventive concepts also provide a substrate treating apparatus capable of making a temperature distribution of a dielectric plate uniform by precisely controlling a temperature of the dielectric plate every area.

One aspect of embodiments of the inventive concept is directed to provide a substrate treating apparatus which includes a chamber, a support unit, a dielectric plate, a gas supplying unit, an antenna, and a heating unit. The chamber may have a processing space therein, and an upper surface of the processing space may be opened. The support unit may be disposed in the chamber and supports a substrate. The dielectric plate may be installed on the opened upper surface of the chamber to cover the opened upper surface. The gas supplying unit may supply a gas in the chamber. The antenna may be disposed above the dielectric plate and may create plasma from the gas. The heating unit may be disposed above the antenna and may heat the dielectric plate.

The heating unit may include a plurality of lamps and a radiation angle limiting unit configured to limit a radiation angle of light incident onto the dielectric plate from the lamps.

The radiation angle limiting unit may include a housing having a side wall surrounding a side portion of the lamp such that the light is not directly incident onto the antenna.

The radiation angle limiting unit may include a housing having a side wall and an upper wall to provide a space of which the bottom is opened, and wherein the lamp is disposed in the space.

The housing may be configured such that the light is not directly radiated to the antenna.

An inner wall of the housing may be formed of a material of reflecting the light.

The housing and the lamp may be formed to have a ring shape.

The housing may be formed to be rotatable on the basis of a horizontal axis.

A reflection member may be removable and may be installed on an inner surface of the housing.

The reflection member may include a first reflection member and a second reflection member. The first and second reflection members may be formed to have different reflection angles, and one selected from the first reflection member and the second reflection member may be installed at the housing.

The antenna may include a first antenna configured to create the plasma at a center area of the chamber; and a second antenna disposed to be spaced from the outside of the first antenna and configured to create the plasma at an edge area of the chamber. The first and second antennas may be formed to have a ring shape.

The heating unit may include a first heating unit placed above an area between the first antenna and the second antenna.

The heating unit may further include a second heating unit placed above the outside of the second antenna.

The heating unit may further include a third heating unit placed above the inside of the first antenna.

The substrate treating apparatus may further include a heater configured to heat the dielectric plate at a side portion of the dielectric plate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
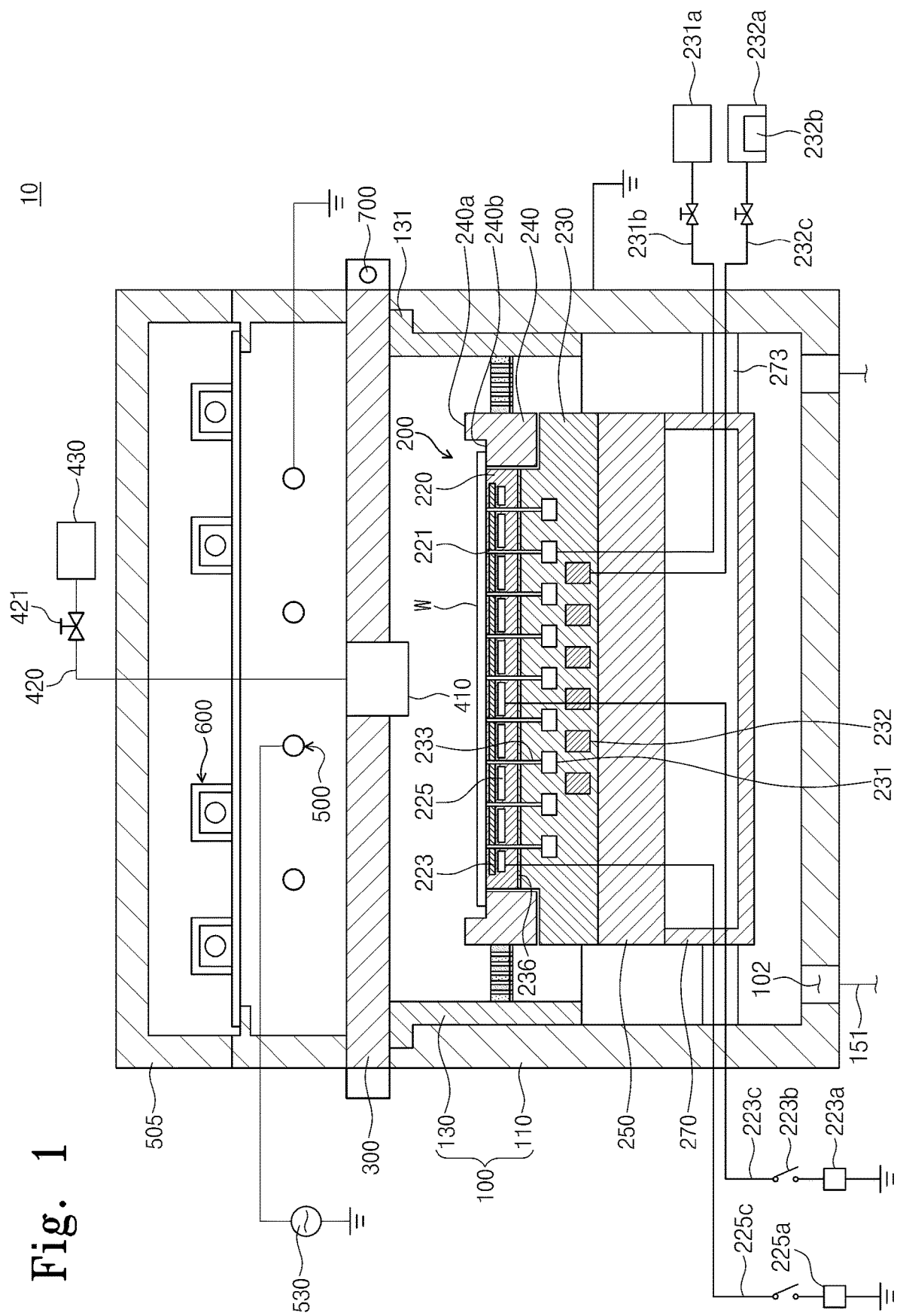
FIG. 1 is a cross-sectional view of a substrate treating apparatus according to an exemplary embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross-sectional view of a substrate treating apparatus according to an exemplary embodiment of the inventive concept. Referring to FIG. 1, a substrate treating apparatus 10 treats a substrate W using plasma. For example, substrate treating apparatus 10 may perform etching process about substrate W. The substrate treating apparatus 10 contains a chamber 100, a support unit 200, a dielectric plate 300, a gas supplying unit 400, an antenna 500, and a heating unit 600.

The chamber 100 provides a space where a substrate treating process is performed. The chamber 100 includes a chamber housing 110 and a liner 130.

The chamber housing 110 has a space of which an upper surface is opened. An inner space of the chamber housing 110 is provided as a space where a substrate treating process is performed. The chamber housing 110 may be formed of a metallic material. The chamber housing 110 may be formed of an aluminum material. The chamber housing 110 may be grounded. Exhaust holes 102 are formed at a bottom surface of the chamber housing 110. The exhaust holes 102 are connected with an exhaust line 151. A gas in an inner space of the chamber housing 110 and a by-product generated staying in treating a substrate are exhausted to the outside through the exhaust line 151. An inner pressure of the chamber housing 110 is lowered.

The liner 130 is provided in the chamber housing 110. The liner 130 has an inner space having opened upper and lower surfaces. The liner 130 may be provided to have a cylindrical shape. The liner 130 has a radius corresponding to an inside surface of the chamber housing 110. The liner 130 is provided along the inside surface of the chamber housing 110. The liner 130 protects an inside surface of the chamber housing 110. For example, the liner 130 prevents the inside surface of the chamber housing 110 from being damaged by arc discharge. Also, the liner 130 prevents impurities, generated during treating, from being deposited on an inside wall of the chamber housing 110.

The support unit 200 is disposed in the chamber housing 110. The support unit 200 supports the substrate W. The support unit 200 includes an electrostatic chuck 210 that adsorbs the substrate W using an electrostatic force. In contrast, the support unit 200 may support the substrate W using various manners such as mechanical clamping. Below, the support unit 200 including the electrostatic chuck 210 will be described.

The support unit 200 includes the electrostatic chuck 210, an insulation plate 250, and a lower cover 270. The support unit 200 is disposed to be upwardly spaced from a bottom surface of the chamber housing 110 in the chamber 100. The electrostatic chuck 210 includes an inner dielectric plate 220, an electrode 223, an inner heater 225, a support plate 230, and a focus ring 240.

The inner dielectric plate 220 is placed on the electrostatic chuck 210. The inner dielectric plate 220 is formed of a disc shape of dielectric substance. The substrate W is placed on an upper surface of the inner dielectric plate 220. A radius of the upper surface of the inner dielectric plate 220 has smaller than that of the substrate W. A first supply path 221 that is used as a path for transferring a heat transfer medium to a lower surface of the substrate W is formed at the inner dielectric plate 220. The electrode 223 and the inner heater 225 are laid in the inner dielectric plate 220. The electrode 223 is placed on the heater 225. The electrode 223 is electrically connected with a first lower power supply 223a. A current applied to the electrode 223 permits an electrostatic force to be generated between the electrode 223 and the substrate W, and the substrate W is adsorbed on the inner dielectric plate 220 by the electrostatic force. The inner heater 225 is electrically connected with a second lower power supply 225a. The inner heater 225 resists a current applied from the second lower power supply 225a to generate a heat. The generated heat is transferred to the substrate W through the inner dielectric plate 220. The heat generated by the inner heater 225 enables the substrate W to remain at a predetermined temperature. The inner heater 225 may include a spiral shape of coil. The support plate 230 is placed under the inner dielectric plate 220. A lower surface of the inner dielectric plate 220 and an upper surface of the support plate 230 are adhered by an adhesive 236. The support plate 230 includes a first circulation path 231, a second circulation path 232, and a second supply path 233. The first circulation path 231 is used as a path where a heat transfer medium is circulated. The second circulation path 232 is used as a path where cooling fluid is circulated. The second supply path 233 connects the first circulation path 231 and the first supply path 221. The focus ring 240 is disposed at an edge of the electrostatic chuck 210. The focus ring 240 has a ring shape. The focus ring 240 is disposed along an edge of the inner dielectric plate 220 to support an edge of the substrate W. The insulation plate 250 is placed under the support plate 230. The insulation plate 250 is formed of an insulation material and electrically insulates the support plate 230 and the lower cover 270. The lower cover 270 is placed under the support plate 200. A lift pin module (not shown) for sending a transferred substrate W from an external transfer member to the electrostatic chuck 210 is placed in an inner space of the lower cover 270.

The gas supply unit 400 supplies a process gas into the chamber housing 110. The gas supply unit 400 includes a gas supply nozzle 410, a gas supply line 420, and a gas storage unit 430. The gas supply nozzle 410 is installed at the center of the dielectric plate 300. A nozzle formed at a lower surface of the gas supply nozzle 410. The nozzle is placed at a bottom of the dielectric plate 300 and supplies a process gas into the chamber 100. The gas supply line 420 connects the gas supply nozzle 410 and the gas storage unit 430. The gas supply line 420 supplies the process gas stored in the gas storage unit 430 to the gas supply nozzle 410. A valve 421 is installed on the gas supply line 420. The valve 421 closes and opens the gas supply line 420 and adjusts a flow of the process gas supplied through the gas supply line 420.

Figure 2:
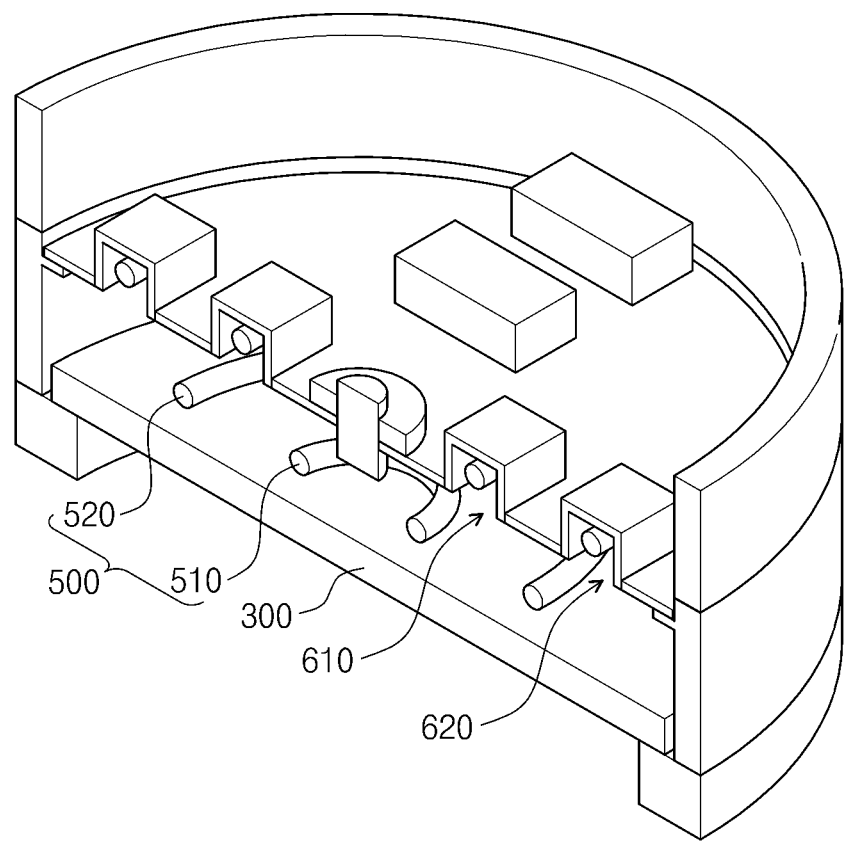
FIG. 2 is a perspective view of a dielectric plate of FIG. 1.
Figure 3:
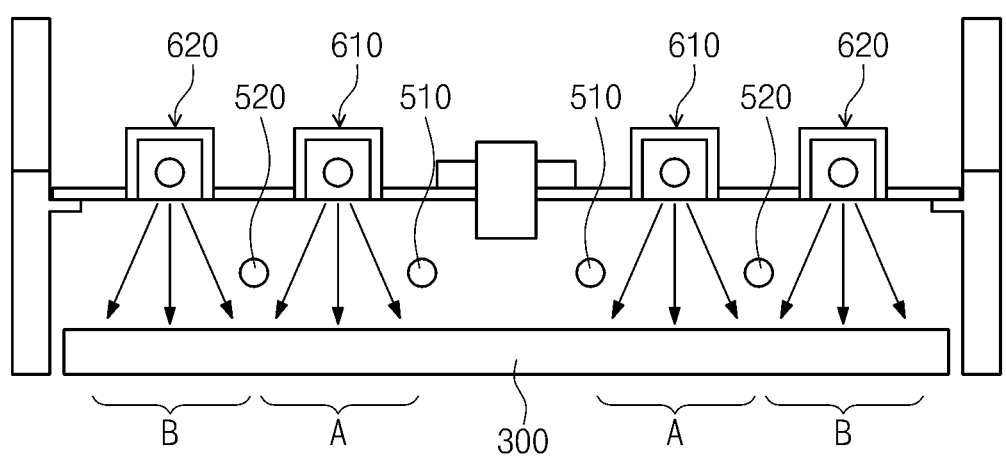
FIG. 3 is a diagram schematically illustrating how light is radiated in FIG. 2.

FIG. 2 is a perspective view of a dielectric plate of FIG. 1. FIG. 3 is a diagram schematically illustrating how light is radiated in FIG. 2.

Referring to FIGS. 1 to 3, a dielectric plate 300 covers an opened upper surface of a chamber housing 110. The dielectric plate 300 is formed in a plate shape and glues up an inner space of the chamber housing 110. The dielectric plate 300 may include a dielectric window.

The dielectric plate 300 maintains a vacuum state of the chamber 100 and simultaneously permits an electric field generated from an antenna 500 to transmit into the chamber 100. The an electric field generated from the antenna 500 is transferred into the chamber 100 through the dielectric plate 300 and reacts with gas in the chamber 100 to create plasma.

The antenna 500 is disposed on the dielectric plate 300. The antenna 500 excites process gas in the chamber 100 into a plasma state. The antenna 500 is disposed in an antenna room 505.

As illustrated in FIGS. 1 to 3, the antenna 500 is implemented with a spiral shape of coil having a plurality of turns. The antenna 500 includes a first antenna 510 and a second antenna 520. The first antenna 510 is disposed at an upper center of the dielectric plate 300. The first antenna 510 creates plasma at a center area of the chamber 100. The second antenna 520 is disposed outside the first antenna 510 to be spaced from the first antenna 510. The second antenna 520 creates plasma at an edge of the chamber 100. The first and second antennas 510 and 520 are formed to have a ring shape. In contrast, shapes and the number of antennas may be variously changed.

The antenna room 505 has a cylindrical shape of which the bottom is opened. The antenna room 505 includes an inner space. The antenna room 505 is configured to have a diameter corresponding to that of the chamber 100. A lower portion of the antenna room 505 is configured to be removable from the dielectric plate 300.

A plasma power supply 530 is connected with the antenna 500. The antenna 500 is supplied with a power from the plasma power supply 530. For example, a high-frequency power may be applied to the antenna 500. If supplied with the high-frequency power, the antenna 500 creates plasma from process gas supplied from a gas supplying unit 400. The plasma power supply 530 is placed outside the chamber 100. When supplied with the high-frequency power, the antenna 500 forms an electric field at a treating space of the chamber 100. The electric field permits the process gas to be excited into a plasma state.

Referring to FIGS. 1 to 3, a heating unit 600 is disposed above the antenna 500. The heating unit 600 heats the dielectric plate 300. The heating unit 600 allows a temperature of the dielectric plate 300 to maintain a constant level of high temperature. The heating unit 600 contains a first heating unit 610, a second heating unit 620, and a third heating unit 630.

Figure 4:
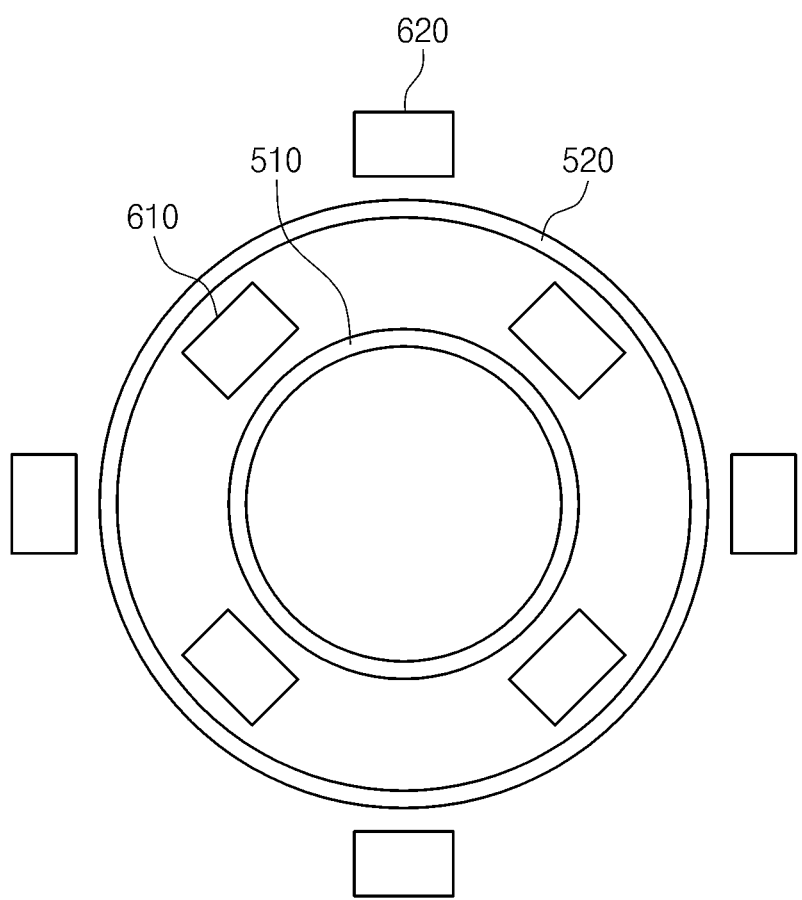
FIGS. 4 to 6 are plan views of an antenna and a heating unit of FIG. 2.
Figure 5:
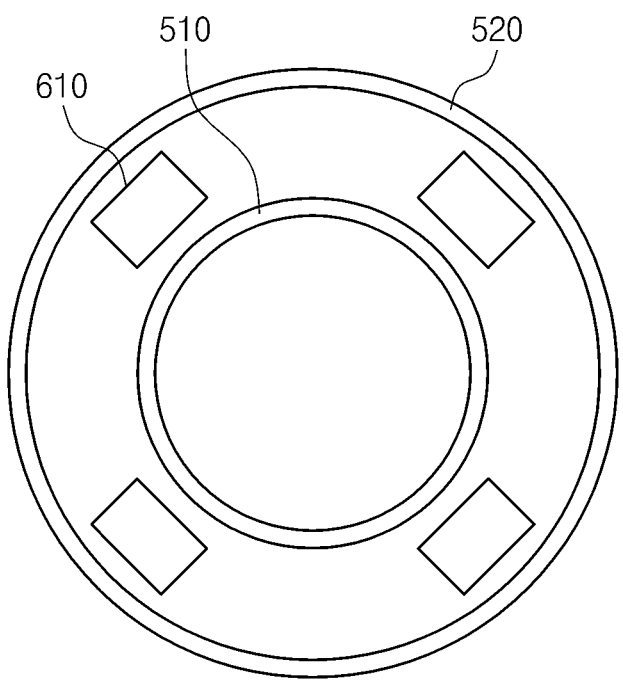
Figure 6:
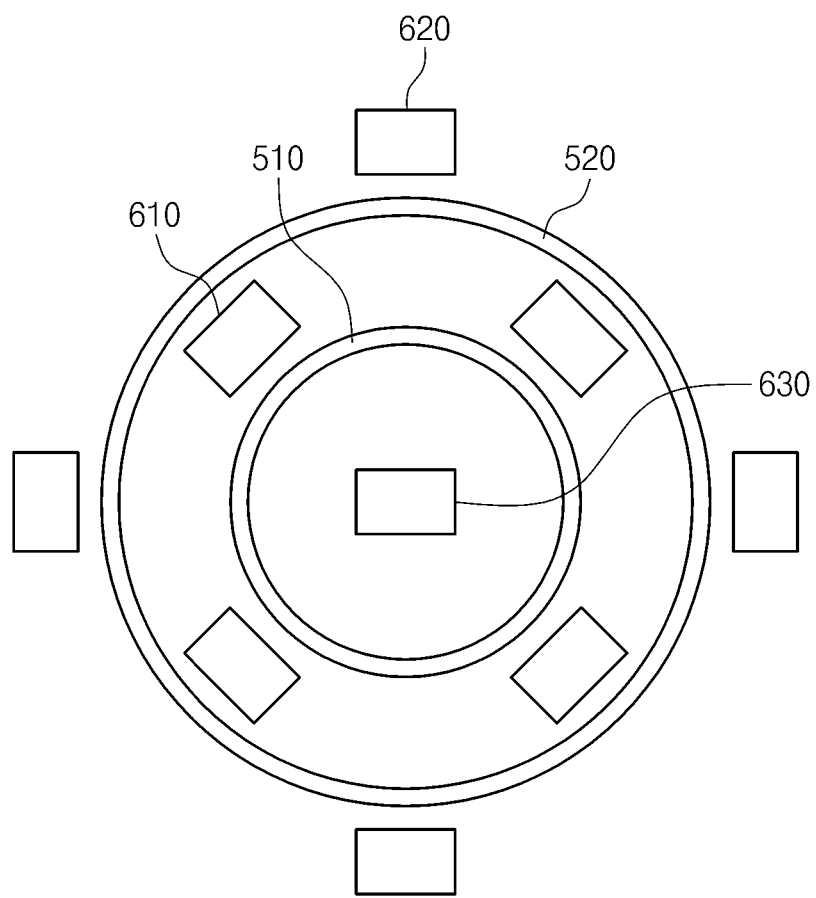

FIGS. 4 to 6 are plan views of an antenna and a heating unit of FIG. 2.

Referring to FIG. 4, a heating unit 600 is configured such that a first heating unit 610 and a second heating unit 620 are together disposed. The first heating unit 610 is placed above an area between a first antenna 510 and a second antenna 520. The second heating unit 620 is placed above the outside of the second antenna 520. As illustrated in FIG. 3, the first heating unit 610 is disposed between the first antenna 510 and the second antenna 520 and heats an area A of a dielectric plate 300 under an area between the first antenna 510 and the second antenna 520. The second heating unit 630 heats an outer area B of the second antenna 520. In FIG. 4, an embodiment of the inventive concept is exemplified as the first four heating units 610 are spaced from each other and each of the second four heating units 620 are disposed between the first two heating units 610 adjacent to each other. However, the number, arrangement, and/or shapes of the first and second heating units 610 and 620 may be variously changed. For example, each of the first and second heating units 610 and 620 may include one lamp having a ring shape.

Referring to FIG. 5, the heating unit 600 is exclusively formed of the first heating units 610 and does not include the second heating units 620. The first heating units 610 are disposed and configured substantially the same as the first heating units 610 of FIG. 4.

Referring to FIG. 6, as well as the first and second heating units 610 and 620, the heating unit 600 further includes a third heating unit 630. The first and second heating units 610 and 620 are disposed and configured substantially the same as the first and second heating units 610 and 620 of FIG. 4. The third heating unit 630 is disposed above inside the first antenna 510. In FIG. 6, an embodiment of the inventive concept is exemplified as the number of third heating units 630 is "1". However, shapes and the number of third heating units 630 may be changed. Optionally, the third heating unit 630 may be omitted.

Referring to FIG. 3, as described above, the heating unit 600 independently heats a center area A and an edge area B of the dielectric plate 300, thereby making it possible to precisely control a temperature of the whole area of the dielectric plate 300, with a RF power-based heating source excluded. Accordingly, the heating source of the heating unit 600 has two heating sources at the remaining areas A and B of the dielectric plate 300 except for an area (excluding A and B) directly heated by a high-frequency power: the heating unit 600 controls a temperature doubly. This structure may allow a temperature of a large-area dielectric plate 300 to be uniformly maintained at a constant temperature (e.g., about 3°).

Figure 7:
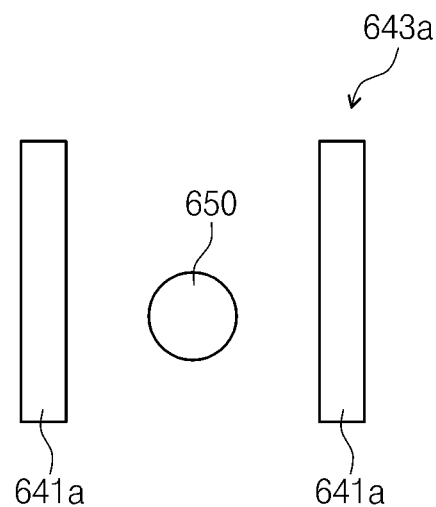
FIG. 7 is a diagram schematically illustrating a heating unit of FIG. 2, according to another exemplary embodiment of the inventive concept.
Figure 8:
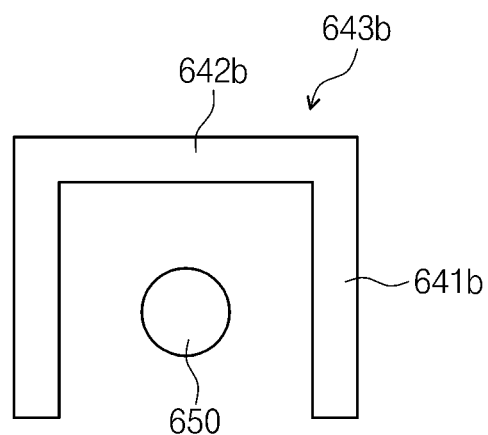
FIGS. 8 and 9 are diagrams schematically illustrating a heating unit of FIG. 2, according to still another exemplary embodiment of the inventive concept.
Figure 9:
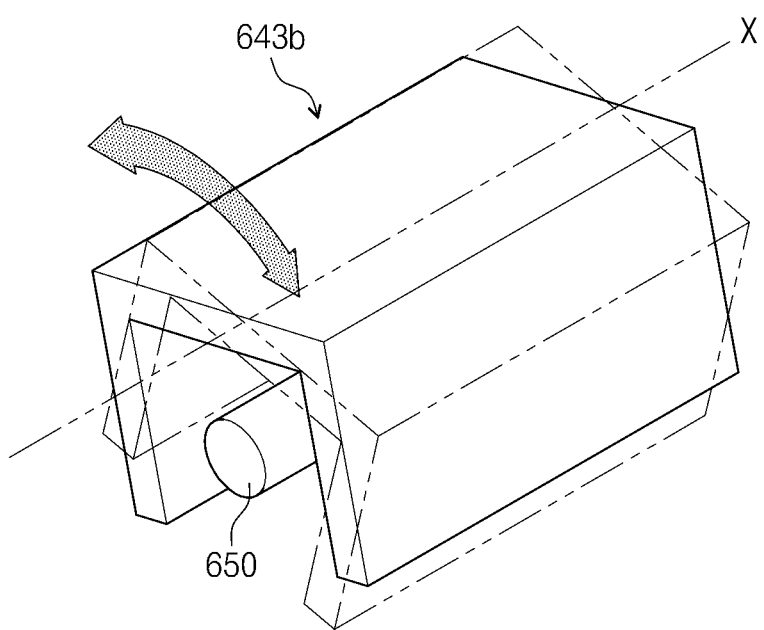

FIG. 7 is a diagram schematically illustrating a heating unit of FIG. 2, according to another exemplary embodiment of the inventive concept. FIGS. 8 and 9 are diagrams schematically illustrating a heating unit of FIG. 2, according to still another exemplary embodiment of the inventive concept.

The heating unit 600 includes a lamp 650 and a radiation angle limiting unit 640. A plurality of lamps may be used. For example, the lamp 650 may be a halogen lamp. The lamp 650 acts as a heating source that allows a temperature of a dielectric plate 300 to maintain a constant level of high temperature.

The radiation angle limiting unit 640 is provided to correspond to the lamp 650. That is, the radiation angle limiting unit 640 may be installed every lamp. The radiation angle limiting unit 640 limits a radiation angle of light incident onto a dielectric plate from the lamp 650.

The radiation angle limiting unit 640 includes a housing 643a. Referring to FIG. 7, the hosting 643a has a side wall 641a to prevent the light from being directly incident onto an antenna 500.

Referring to FIG. 8, the heating unit 600 includes a lamp 650 and a housing 643b. The lamp 650 is substantially the same as that of FIG. 7. The housing 643b has a side wall 641b and an upper wall 642b to form a space of which the bottom is opened. The lamp 650 is disposed in the space of the housing 643b. Likewise, the housing 643b prevents the light from being directly incident onto the antenna 500.

In an upper area of the chamber 100, a temperature difference occurs according to whether the antenna 500 is disposed. That is, a temperature of an upper area of the chamber 100 above which the antenna 500 is disposed may be higher than that of an upper area of the chamber 100 above which the antenna 500 is not disposed. The housing 643a/643b permits light to be focused on a dielectric plate 300, thereby increasing a temperature of the upper area in the chamber 100 above which the antenna 500 is not disposed. This means that a temperature distribution in the chamber 100 is overall uniformly formed.

As described above, the housing 643a/643b prevents light of the lamp 650 from being directly incident onto the antenna 500, thereby making it possible to prevent overheating of the antenna 500. That is, the housing 643a/643b allows the light to be incident onto the dielectric plate 300 through spaces between the antennas 500.

Also, inner wall of the housing 643a/643b may be formed of a material for reflecting the light, so a lot of light reaches the dielectric plate 300.

An embodiment of the inventive concept is exemplified as a lamp is used as a heating source for heating the dielectric plate 300. In contrast, the heating source may be implemented with a nonmetallic heating element such as a carbon nanotube (CNT) film heater, etc. or in a noncontact manner.

Referring to FIG. 9, the heating unit 600 includes a lamp 650 and a housing 643a/643b. The lamp 650 and the housing 643a/643b are configured substantially the same as those of FIG. 7. Here, the housing 643a/643b is provided to be rotatable with the horizontal axis X as the center. The housing 643a/643b may be configured such that its slope is adjusted rightward or leftward by a constant angle with the horizontal axis X as the center. This is to adjust a radiation range of light from the lamp 650 such that the light is not directly radiated to the antenna 500 and is focused on a specific area of the dielectric plate 300. The housing 643a/643b may be rotated by an operator or by a driver.

Figure 10A:
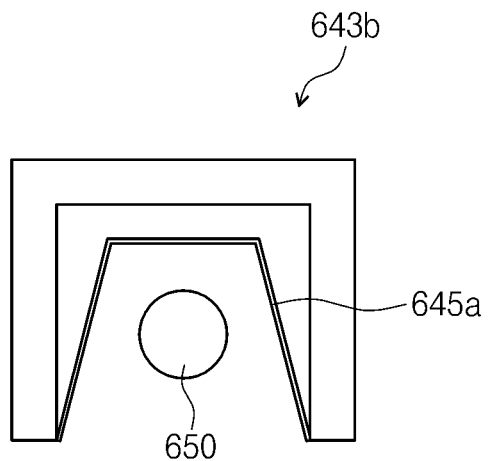
FIG. 10A is a diagram schematically illustrating a reflection member bound on a housing of FIG. 8, according to an exemplary embodiment of the inventive concept.
Figure 10B:
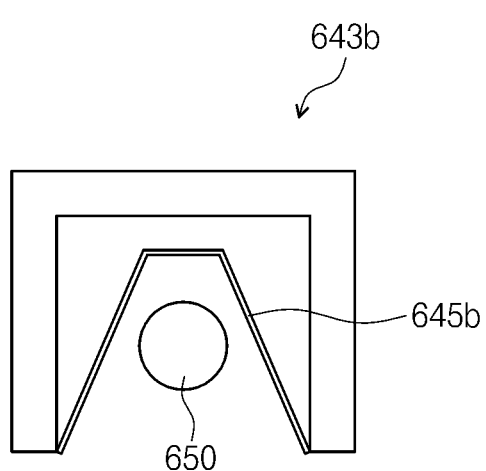
FIG. 10B is a diagram schematically illustrating a reflection member bound on a housing of FIG. 8, according to another exemplary embodiment of the inventive concept.

FIG. 10A is a diagram schematically illustrating a reflection member bound on a housing of FIG. 8, according to an exemplary embodiment of the inventive concept. FIG. 10B is a diagram schematically illustrating a reflection member bound on a housing of FIG. 8, according to another exemplary embodiment of the inventive concept.

Referring to FIGS. 10A and 10B, a reflection member 645 is installed in the housing 643a/643b. The reflection member 645 is removable. That is, it is possible to replace the reflection member 645. The reflection member 645 includes a first reflection member 645a and a second reflection member 645b.

As illustrated in FIGS. 10A and 10B, the first and second reflection members 645a and 645b are installed to reflect light by different reflection angles. One selected from the first and second reflection members 645a and 645b may be installed at the housing 643a/643b. The first reflection member 645a or the second reflection member 645b controls light issued from a lamp 650 to be not directly incident onto an antenna 500. In addition, the light may be focused on a specific area of a dielectric plate 300. That is, a temperature of a specific portion of the dielectric plate 300 is locally controlled by variably controlling a reflection angle through a plurality of reflection members 645 having different reflection angles.

As described above, the inventive concept limits a radiation angle of light from the lamp 650 using at least one of a housing 643a/643b having a sidewall 641a/641b, a rotatable housing 643a/643b, and/or a reflection member 645, thereby making it possible to prevent light from being incident onto an antenna 500.

Figure 11:
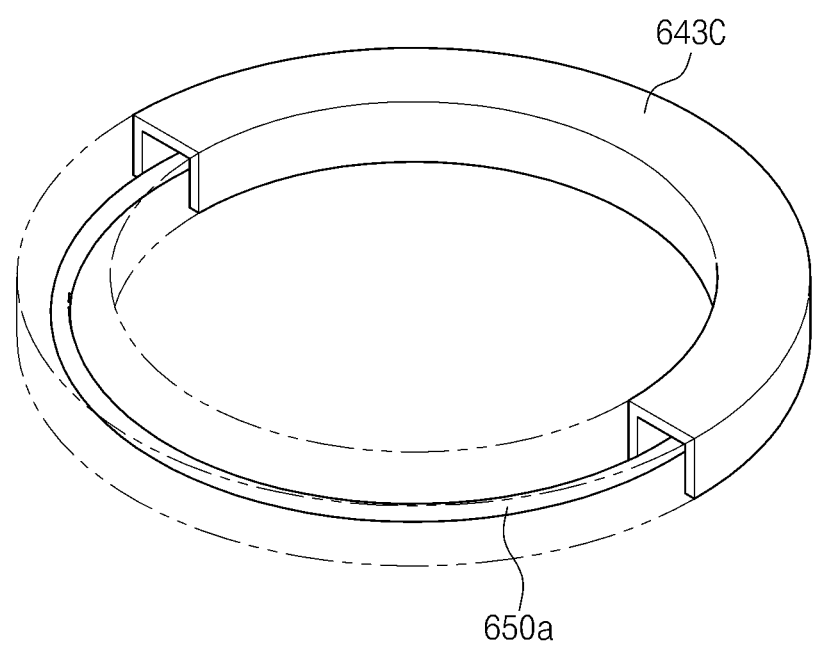
FIG. 11 is a diagram schematically illustrating a heating unit of FIG. 2, according to still another exemplary embodiment of the inventive concept.

FIG. 11 is a diagram schematically illustrating a heating unit of FIG. 2, according to still another exemplary embodiment of the inventive concept. Referring to FIG. 11, a housing 643c and a lamp 650a are formed to have a ring shape. That is, the ring-shaped lamp 650a is disposed in the ring-shaped housing 643c of which the bottom is opened and radiates light. Here, the lamp 650a may be implemented with a ring-shaped halogen lamp.

Returning to FIG. 1, a substrate treating apparatus 10 of the inventive concept further includes a heater 700 that heats the dielectric plate 300 at a side portion of the dielectric plate 300. The heater 700 may be a sheath heater. Accordingly, a temperature of the dielectric plate 300 is more efficiently controlled through the heater 700 placed at the side portion of the dielectric plate 300 and the heating unit 600 disposed above the dielectric plate 300.

As described above, it is possible to improve process efficiency by overall heating the dielectric plate 300 upon treating the wafer W using plasma. Also, a temperature of the dielectric plate 300 is uniformly distributed by precisely controlling temperatures of areas of the dielectric plate 300 independently.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising: a chamber having a processing space therein, an upper surface of the processing space being opened; a support unit being disposed in the chamber and configured to support a substrate; a dielectric plate installed on an opened upper surface of the chamber to cover the opened upper surface; a gas supplying unit configured to supply a gas in the chamber; an antenna assembly configured to create a plasma from the gas, the antenna assembly including a first antenna and a second antenna; and a heating unit configured to radiate heat to the dielectric plate, the heating unit including a first heater and a second heater, wherein the heating unit comprises a radiation angle limiting unit for each of the first and second heaters, configured to limit a radiation angle of the heat, which is radiated past each of the first and second antennas, incident onto the dielectric plate from the first and second heaters, wherein the heating unit, the antenna assembly, and the dielectric plate are consecutively arranged in a vertical order from a top of the chamber, wherein the first antenna, the first heater, the second antenna, and the second heater are arranged in order from a center of the chamber when viewed from a top of the chamber, wherein the radiation angle limiting unit comprises a housing having a side wall surrounding a side portion of each of the first and second heaters, wherein a radiated area of the dielectric plate, which is radiated by the heating unit, is larger than an area of the heating unit, wherein the first antenna and the second antenna are located out of the radiation angle.

2. The substrate treating apparatus of claim 1, wherein the radiation angle limiting unit comprises a housing having a side wall and an upper wall to provide a space of which the bottom is opened, and wherein the lamp is disposed in the space.

3. The substrate treating apparatus of claim 2, wherein the housing is configured such that the light is not directly radiated to the antenna.

4. The substrate treating apparatus of claim 1, wherein an inner wall of the housing is formed of a material of reflecting the light.

5. The substrate treating apparatus of claim 1, wherein the housing and the first and second heaters are formed to have a ring shape.

6. The substrate treating apparatus of claim 1, wherein the housing is formed to be rotatable on the basis of a horizontal axis.

7. The substrate treating apparatus of claim 1, wherein a reflection member is removable and is installed on an inner surface of the housing.

8. The substrate treating apparatus of claim 7, wherein the reflection member comprises a first reflection member and a second reflection member,
wherein the first and second reflection members are formed to have different reflection angles, and
wherein one selected from the first reflection member and the second reflection member is installed at the housing.

9. The substrate treating apparatus of claim 1, wherein the first antenna is further configured to create the plasma at a center area of the chamber; and
wherein the second antenna is further configured to create the plasma at an edge area of the chamber, and
wherein the first and second antennas are formed to have a ring shape.

10. The substrate treating apparatus of claim 9, wherein the heating unit further comprises:
a third heating unit placed above the inside of the first antenna.

11. The substrate treating apparatus of claim 1, further comprising a side heating unit configured to heat the dielectric plate at a side portion of the dielectric plate.

* * * * *